(12) United States Patent
Hachiya

(10) Patent No.: US 9,480,153 B2
(45) Date of Patent: Oct. 25, 2016

(54) HOUSING FOR ELECTRONIC CIRCUIT UNIT

(71) Applicant: AISAN KOGYO KABUSHIKI KAISHA, Obu-shi, Aichi-ken (JP)

(72) Inventor: Masahiro Hachiya, Chita (JP)

(73) Assignee: AISAN KOGYO KABUSHIKI KAISHA, Obu-Shi, Aichi-Ken (JP)

( * ) Notice: Subject to any disclaimer, the term of this patent is extended or adjusted under 35 U.S.C. 154(b) by 0 days.

(21) Appl. No.: 14/922,382

(22) Filed: Oct. 26, 2015

(65) Prior Publication Data

US 2016/0126714 A1    May 5, 2016

(30) Foreign Application Priority Data

Oct. 30, 2014  (JP) ................................. 2014-221700

(51) Int. Cl.
| | |
|---|---|
| H05K 1/02 | (2006.01) |
| F02M 37/00 | (2006.01) |
| H05K 1/11 | (2006.01) |
| H05K 3/00 | (2006.01) |
| H05K 3/20 | (2006.01) |
| H05K 5/00 | (2006.01) |

(52) U.S. Cl.
CPC ........ H05K 1/0284 (2013.01); F02M 37/0076 (2013.01); H05K 1/119 (2013.01); H05K 3/0014 (2013.01); H05K 3/20 (2013.01); H05K 5/00 (2013.01); H05K 2201/09118 (2013.01); H05K 2201/10272 (2013.01)

(58) Field of Classification Search
USPC ........................................................ 174/99 B
See application file for complete search history.

(56) References Cited

U.S. PATENT DOCUMENTS

| | | | |
|---|---|---|---|
| 8,217,265 B2 | 7/2012 | Shimizu et al. | |
| 8,559,167 B1 * | 10/2013 | Czarnecki ................ | H02B 1/46 174/50 |
| 8,743,532 B2 * | 6/2014 | Yano ........................ | H02B 1/56 165/104.33 |
| 8,835,760 B2 * | 9/2014 | Saimoto ................. | H01R 13/42 174/50 |

FOREIGN PATENT DOCUMENTS

| | | |
|---|---|---|
| JP | 2002-118926 A | 4/2002 |
| JP | 2004-120838 A | 4/2004 |
| JP | 2009-284724 A | 12/2009 |
| JP | 2010-046835 A | 3/2010 |

\* cited by examiner

*Primary Examiner* — Dhirubhai R Patel
(74) *Attorney, Agent, or Firm* — Conley Rose, P.C.

(57) ABSTRACT

A housing for an electronic circuit unit has a housing body and a bus bar. The housing body is made from a resin material and includes a bottom wall part and a side wall part for defining an inner space where electronic components are located. The bus bar includes a base portion buried in the bottom wall part and a folded portion buried in the side wall part. The folded portion includes two ends each connected to the base portion.

5 Claims, 8 Drawing Sheets

HOUSING FOR ELECTRONIC CIRCUIT UNIT

CROSS-REFERENCE TO RELATED APPLICATIONS

This application claims priority to Japanese patent application serial number 2014-221700, filed Oct. 30, 2014, the contents of which are incorporated herein by reference in their entirety for all purposes.

STATEMENT REGARDING FEDERALLY SPONSORED RESEARCH OR DEVELOPMENT

Not applicable.

BACKGROUND

This disclosure relates to a housing for an electronic circuit unit, which houses electronic components therein.

Japanese Laid-Open Patent Publication No. 2002-118926 discloses a housing for an electronic circuit unit, which includes a housing body and bus bars. The housing body is made from a resin material and has a bottom wall and four side walls, which define an inner space. Each of the bus bars includes a bus bar body buried in the bottom wall of the housing body through insert molding.

In the housing of Japanese Laid-Open Patent Publication No. 2002-118926, each of the bus bar bodies of the bus bars is formed in a flat shape, and the bus bars do not include any folded portion, which is connected to the bus bar body and is buried in the side wall. Thus, the bus bars cannot prevent or reduce molding shrinkage of the side walls. Accordingly, there has been a need for an improved housing for an electronic circuit unit.

BRIEF SUMMARY

In one aspect of this disclosure, a housing for an electronic circuit unit has a housing body and a bus bar. The housing body is made from a resin material and includes a bottom wall part and a side wall part for defining an inner space where electronic components are located. The bus bar includes a base portion buried in the bottom wall part and a folded portion buried in the side wall part. The folded portion includes two ends each connected to the base portion.

According to this aspect of the disclosure, because the folded portion of the bus bar is buried in the side wall part of the housing body, the bus bar can reduce molding shrinkage of the side wall part of the housing body.

DETAILED DESCRIPTION

Each of the additional features and teachings disclosed above and below may be utilized separately or in conjunction with other features and teachings to provide improved housings for electronic circuit units. Representative examples, which utilize many of these additional features and teachings both separately and in conjunction with one another, will now be described in detail with reference to the attached drawings. This detailed description is merely intended to teach a person of skilled in the art further details for practicing preferred aspects of the present teachings and is not intended to limit the scope of the invention. Only the claims define the scope of the claimed invention. Therefore, combinations of features and steps disclosed in the following detailed description may not be necessary in the broadest sense, and are instead taught merely to particularly describe representative examples. Moreover, various features of the representative examples and the dependent claims may be combined in ways that are not specifically enumerated in order to provide additional useful embodiments of the present teachings.

One example of this disclosure will be described in reference to the drawings. Although an electronic circuit unit can be used for various devices, the electronic circuit unit of this example is configured as a fuel pump controller adapted to control a fuel pump for feeding liquid fuel to an internal combustion engine mounted on a vehicle such as automobile. The fuel pump controller is disposed in a trunk room of the vehicle. The fuel pump controller is connected to a fuel pump disposed in a fuel tank and an electronic control unit (ECU) that totally controls an internal combustion engine. Thus, the fuel pump controller regulates electrical power supplied to the fuel pump based on signals output from the ECU.

Figure 1:
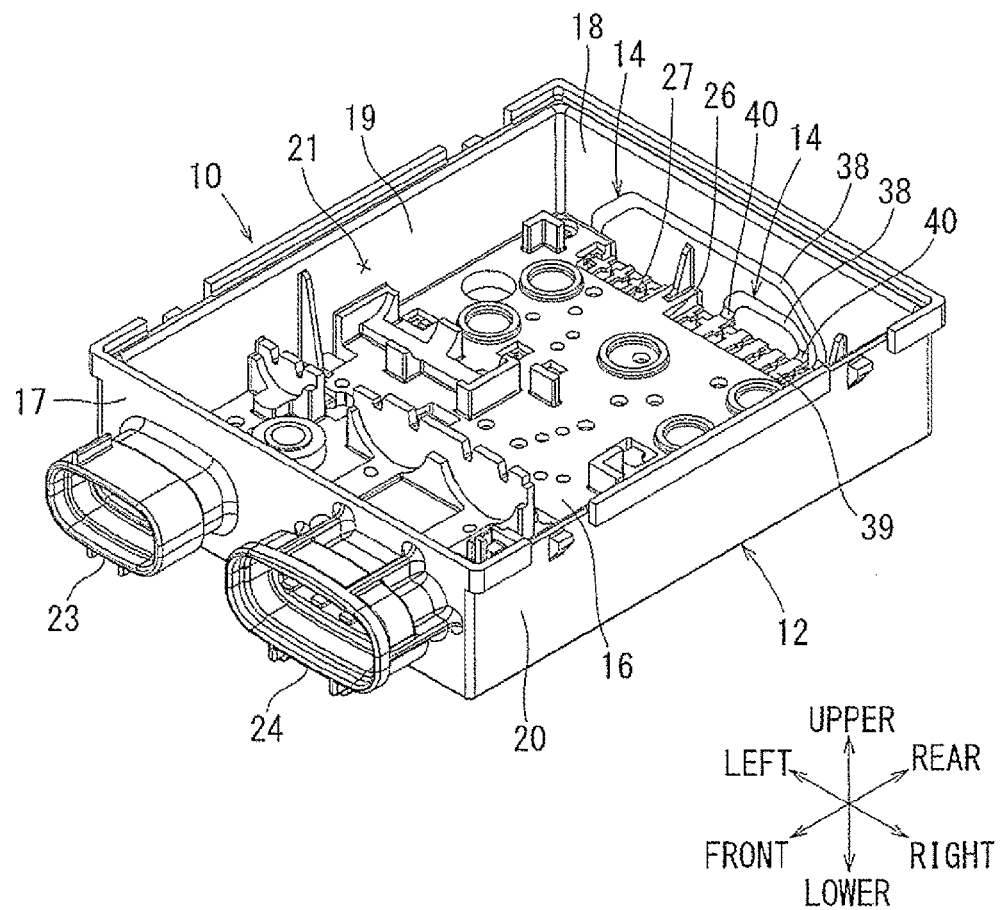
FIG. 1 is a perspective view of a housing for an electronic circuit unit.
Figure 2:
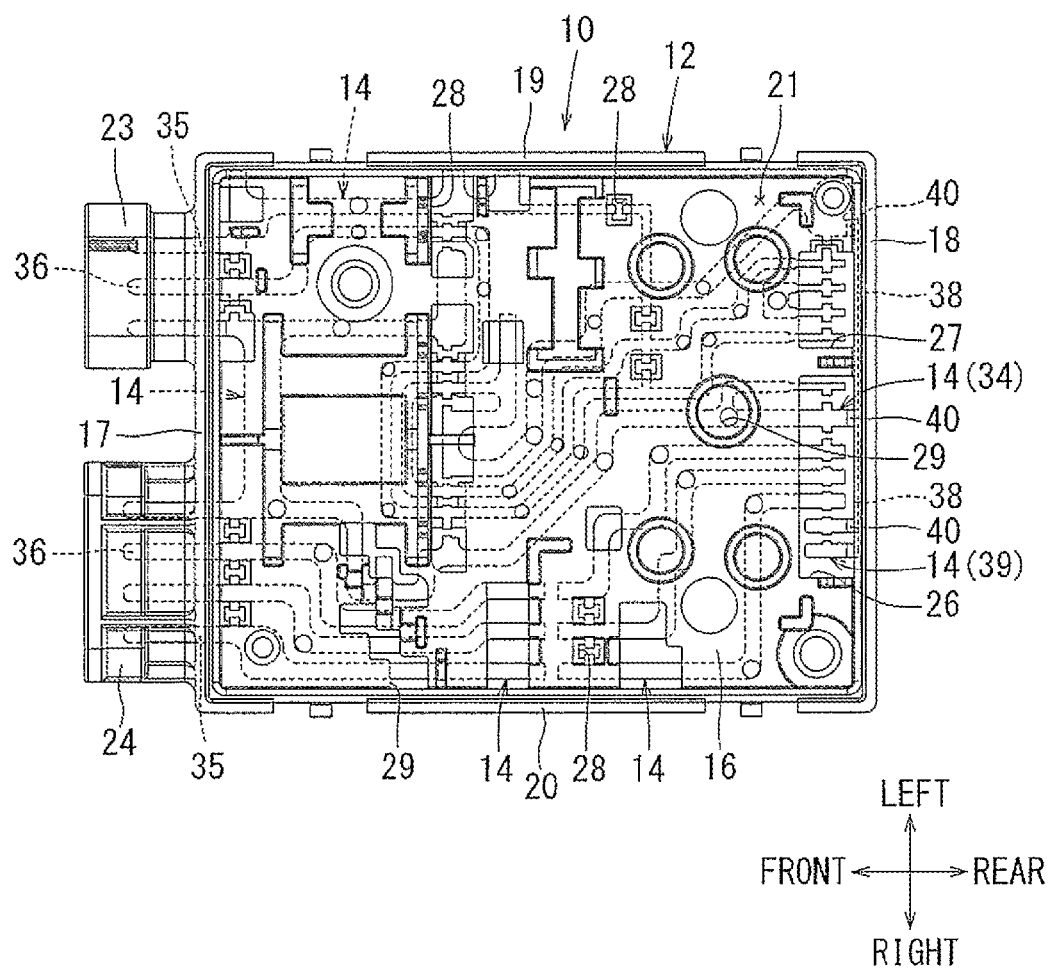
FIG. 2 is a plan view of the housing.

A housing 10 for the electronic circuit unit is shown in FIGS. 1 and 2. For convenience of explanation, directions are defined based on arrows in FIG. 1. However, the directions do not limit installation directions of the housing 10 on the vehicle. The housing 10 is formed to house a plurality of electronic components (not shown) therein. The housing 10 includes a housing body 12 and a plurality of bus bars 14. The housing body 12 is made from a resin material and is formed in a hollow rectangular parallelepiped shape having an open upper end. The housing body 12 includes a bottom wall 16, a front side wall 17, a rear side wall 18, a left side wall 19 and a right side wall 20. The housing body 12 defines therein an inner space 21 for housing a plurality of the electronic components. The front side wall 17 has a left connector 23 and a right connector 24, each of which protrudes forward from the front side wall 17 and is configured to be engaged with a connector of an external device. In particular, the left connector 23 is adapted to be engaged with an external connector (not shown) connected to the ECU. The right connector 24 is adapted to be engaged with an external connector (not shown) connected to the fuel pump.

Figure 3:
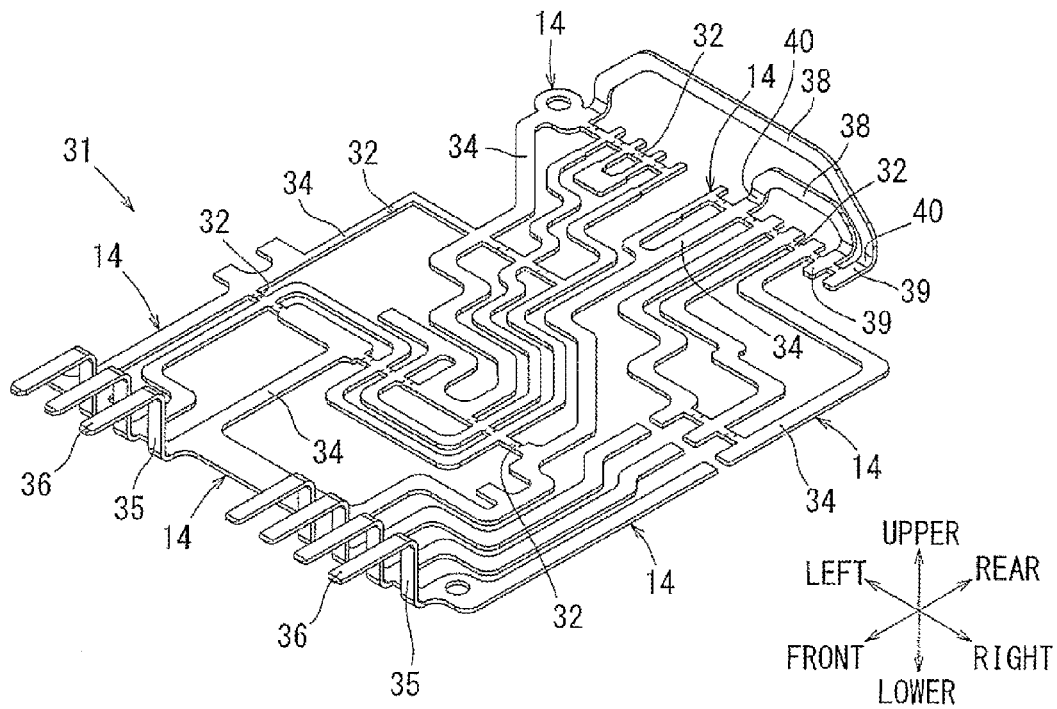
FIG. 3 is a perspective view of a bus bar precursor.

As shown in FIGS. 1 and 2, the bottom wall 16 has a plurality of openings penetrating therethrough, which include a first opening 26, a second opening 27, third openings 28, and fourth openings 29. Each of the first opening 26 and the second opening 27 is positioned at a rear end of the bottom wall 16 and is formed in a rectangular shape extending in the right-left direction. The first opening 26 is positioned at the right of the second opening 27. A rear side surface of the first opening 26 and a rear side surface of the second opening 27 are flush with or substantially flush with an inward facing surface of the rear side wall 18, i.e., a front surface of the rear side wall 18. The third openings 28 are formed to mainly expose tie bars 32 (see FIG. 3), which are described below. The fourth openings 29 are formed to mainly expose connection points for the electronic components. In addition, the bottom wall 16 has positioning openings for positioning the bus bars 14 and the like.

The bus bars 14 are buried in the housing body 12 through insert molding. For the insert molding, a bus bar precursor 31 made by punching a metal plate is used. The bus bar precursor 31 includes the bus bars 14 and tie bars 32. The tie bars 32 connect the adjacent bus bars 14 to each other as viewed in FIG. 3. Here, because the tie bars 32 are removed after the insert molding, the completed housing 10 does not have the tie bars 32 as shown in FIG. 2.

In the bus bar precursor 31 (see FIG. 3), each of the bus bars 14 has a bus bar body 34 (also, referred to as a base portion, hereinafter) such that the bus bar bodies 34 are positioned on the same plane. The bus bar bodies 34 adjacent to each other are connected with one another via at least one of the tie bars 32. Front ends of some of the bus bars 14 positioned at a front part of the bus bar precursor 31 are bent twice such that each of the front ends includes a standing portion 35 continuously extending upward from the bus bar body 34 and a connection terminal 36 extending forward from an upper end of the standing portion 35. The connection terminals 36 are arranged parallel to each other at regular intervals in the right-left direction.

Each rear end of some (two, in this example) of the bus bars 14 positioned at a rear part of the bus bar precursor 31 is formed in an arch-like shape and is bent upward. Thus, each of the rear ends includes an arch-shaped folded portion 38 (also, referred to as a rising portion, hereinafter) continuously extending upward from the bus bar body 34 and an end strip 39 extending horizontally from an end of the folded portion 38 such that the end strip 39 and the bus bar body 34 are arranged on the same plane. The folded portions 38 of the two bus bars 14 are doubly disposed in an arch-like state. The end strips 39 of the two bus bars 14 each having the folded portion 38 are arranged in parallel to each other in the right-left direction. Each bus bar 14 having the folded portion 38 is formed to have a desired conductive path including the folded portion 38 and the end strip 39.

Each bus bar 14 including the folded portion 38 has two inclined portions 40 both between the bus bar body 34 and the folded portion 38 and between the folded portion 38 and the end strip 39 such that the inclined portions 40 smoothly connect the folded portion 38 to both the bus bar body 34 and the end strip 39. Each of the inclined portions 40 is formed in a rounded shape as shown in FIGS. 4-8.

The bus bars 14 are buried in the housing body 12 by the insert molding. In particular, the bus bar body 34 of each bus bar 14 is buried in the intermediate position of the bottom wall 16 in the vertical direction as viewed in FIG. 6. Further, each bus bar 14 having the connection terminal 36 is partially buried in the front side wall 17 such that the standing portion 35 and a base end of the connection terminal 36 are buried in the intermediate position of the front side wall 17 in the front-rear direction. In this example, three of the connection terminals 36 are exposed in the left connector 23 of the housing body 12, and four of the connection terminals 36 are exposed in the right connector 24 of the housing body 12.

Figure 4:
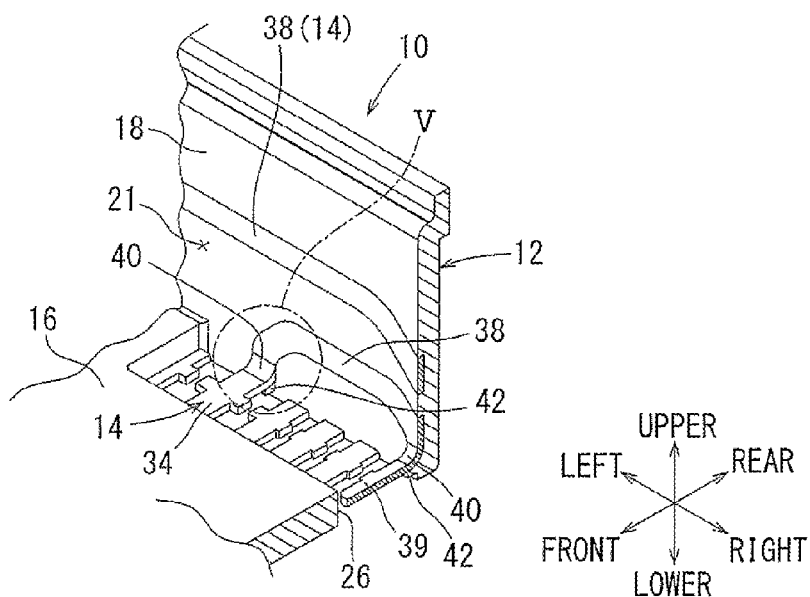
FIG. 4 is a partial cross-sectional perspective view of a part of the housing.
Figure 5:
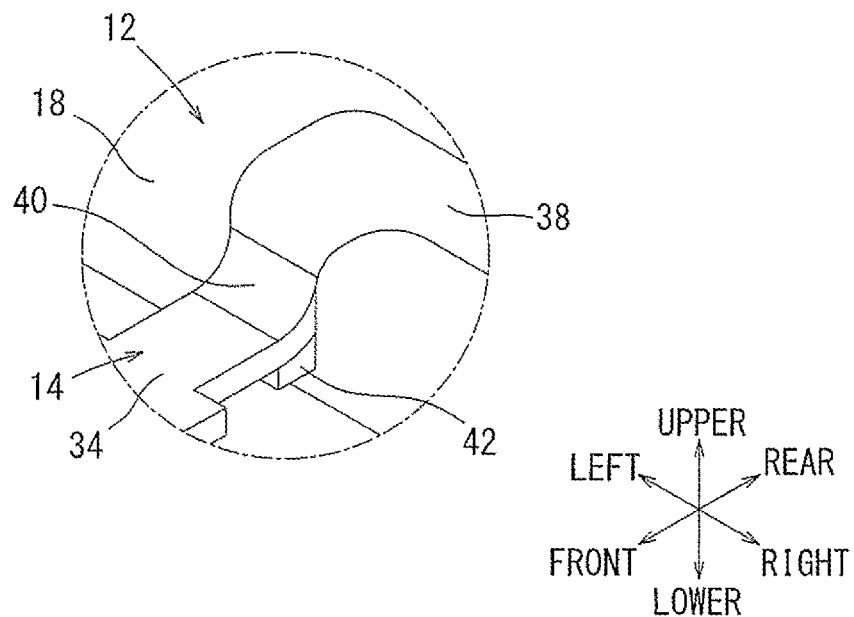
FIG. 5 is an enlarged view of area V shown in FIG. 4.
Figure 6:
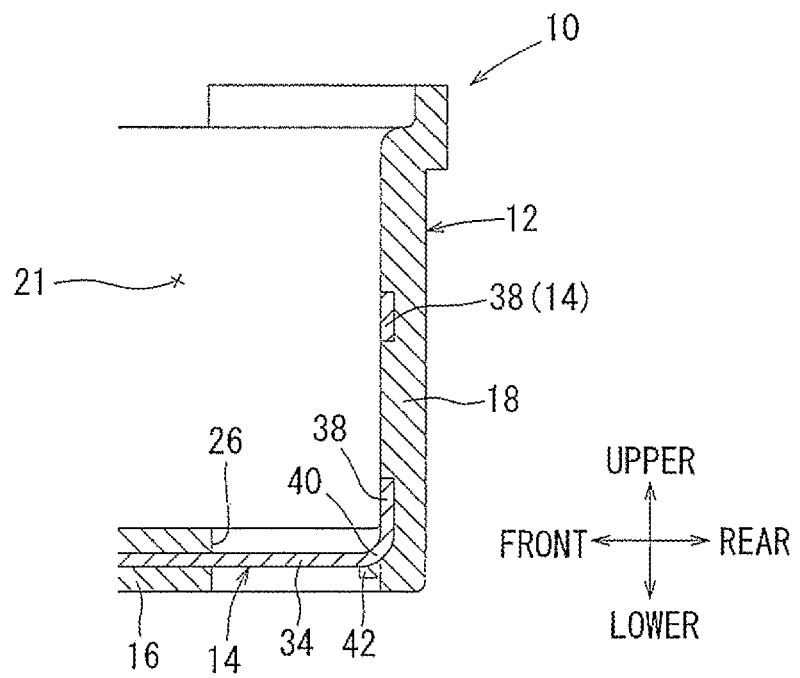
FIG. 6 is a cross-sectional side view of a part of the housing.
Figure 7:
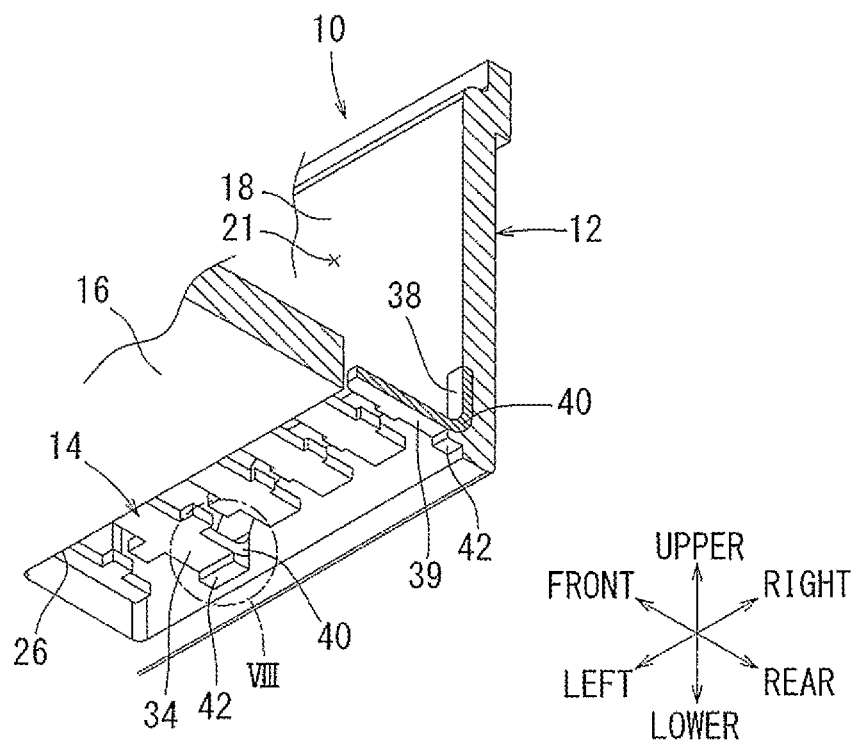
FIG. 7 is a partial cross-sectional perspective view of a part of the housing viewed from below.
Figure 8:
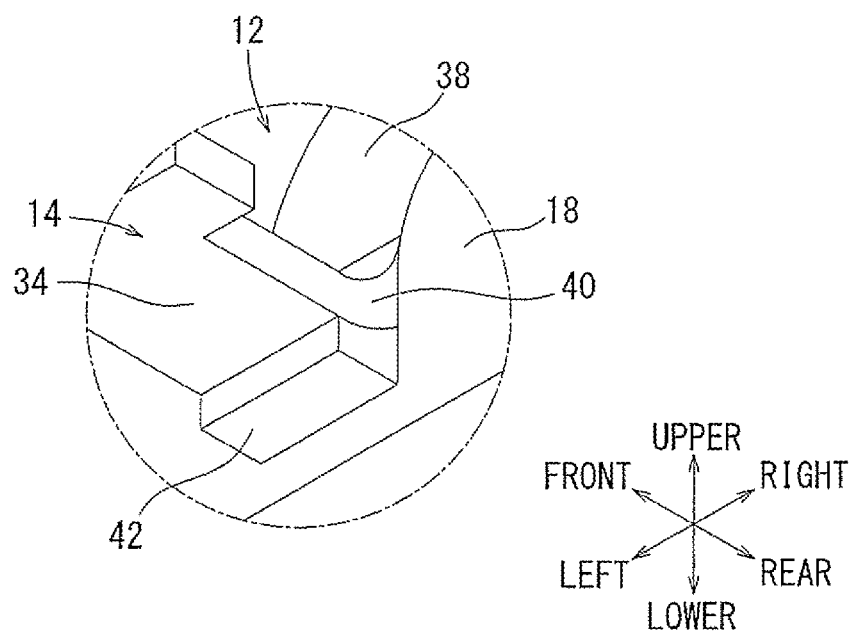
FIG. 8 is an enlarged view of area VIII shown in FIG. 7.

Each of the folded portions 38 is buried in the rear side wall 18 as viewed in FIG. 6 such that an inward facing surface, i.e., a front surface of the folded portion 38 is exposed at the inward facing surface, i.e., the front surface of the rear side wall 18 as viewed in FIGS. 4 and 5. The inward facing surfaces of the folded portions 38 are flush with or substantially flush with the inward facing surface of the rear side wall 18.

As shown in FIG. 2, upper and lower surfaces of both the end strips 39 and rear ends of the bus bar bodies 34 of the bus bars 14 positioned at a right rear part of the bus bar precursor 31 are exposed in the first opening 26 of the bottom wall 16 of the housing body 12. Each of the inclined portions 40, each being connected to one of the bus bar body 34 and the end strips 39, which are exposed in the first opening 26, has an inward facing surface exposed in the first opening 26.

Figure 9:
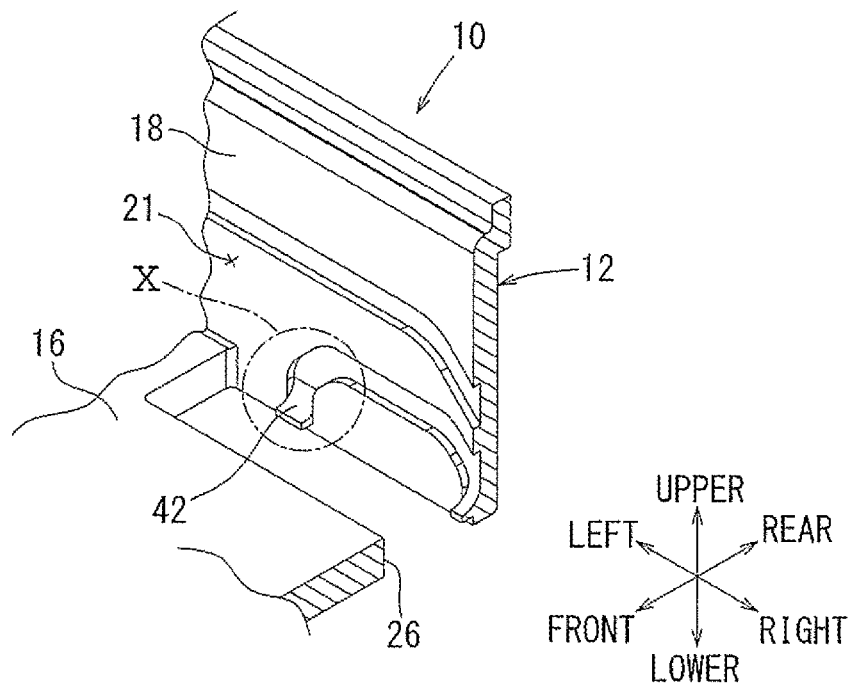
FIG. 9 is a partial cross-sectional perspective view of a part of the housing, where bus bars are not shown.
Figure 10:
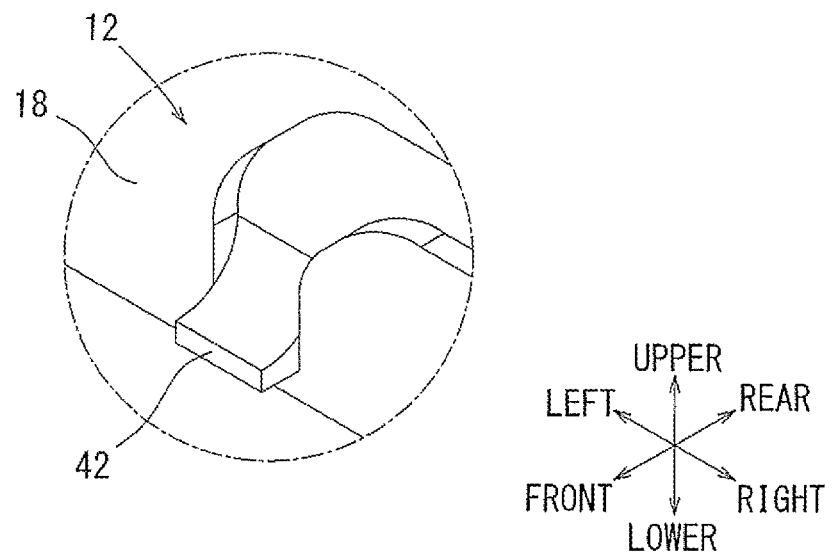
FIG. 10 is an enlarged view of area X shown in FIG. 9.

As shown in FIG. 6, the housing body 12 has covering parts 42 for filling recesses defined by outward facing surfaces of the inclined portions 40 and an outer periphery of the first opening 26, in particular, the rear side surface of the first opening 26. The covering parts 42 protrude forward from the rear side surface of the first opening 26 as viewed in FIGS. 9 and 10.

As shown in FIG. 2, each of the bus bar bodies 34 of the bus bars 14 positioned at a left rear part of the bus bar precursor 31 has a rear end, whose upper and lower surfaces are exposed in the second opening 27 of the bottom wall 16 of the housing body 12. Here, among the bus bars 14, each having the folded portion 38, the left bus bar 14 is buried in the bottom wall 16 of the housing 12 such that the bus bar body 34, a basal end of the folded portion 38 and the inclined portion 40 of the left bus bar 14 are buried in the intermediate position of the bottom wall 16 in the vertical direction.

Immediately after the insert molding of the housing 10, upper and lower surfaces of the tie bars 32 of the bus bar precursor 31 are exposed in the first opening 26, the second opening 27 or the third openings 28. In addition, each of the bus bar bodies 34 has at least one connection point adapted to be connected to one of the electronic components such that the connection point is positioned to be exposed in one of the fourth openings 29. Thus, after the insert molding of the housing 10, the tie bars 32 each exposed in the first opening 26, the second opening 27 or the third openings 28 are removed by cutting or the like. As a result, the bus bars 14 are independent from each other, thereby completing the housing 10.

Figure 11:
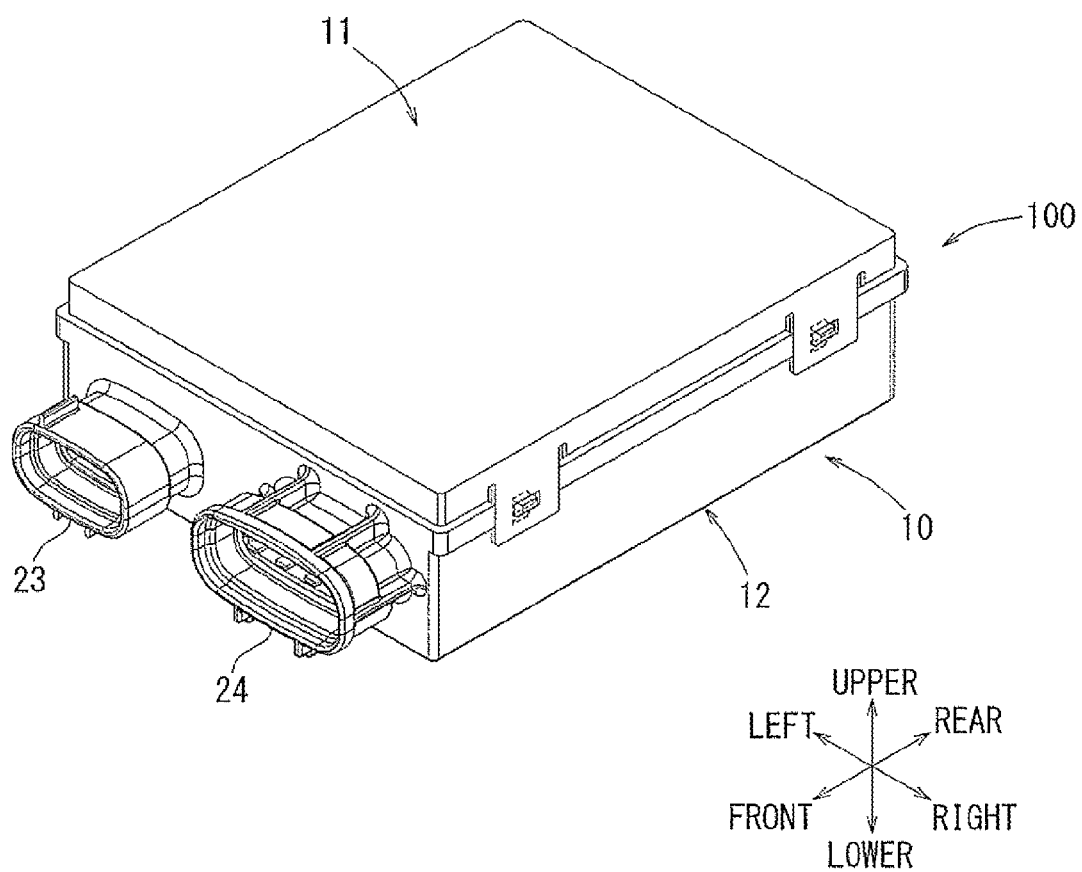
FIG. 11 is a perspective view of an electronic circuit unit.

In the first opening 26, the second opening 27 and the fourth openings 29 of the housing body 12 of the housing 10, the bus bar bodies 34 (including the end strips 39) of the bus bars 14 are engaged with terminals of the electronic components (not shown), respectively, by resistance welding or the like. The bus bars 14 and the electronic components form an electronic circuit. The electronic components are composed of, for example, a capacitor, a coil and an integrated circuit (IC). These electronic components are housed in the housing 10. Further, when the upper opening of the housing 10 is closed with a lid 11, an electronic circuit unit 100 is completed as viewed in FIG. 11.

Figure 12:
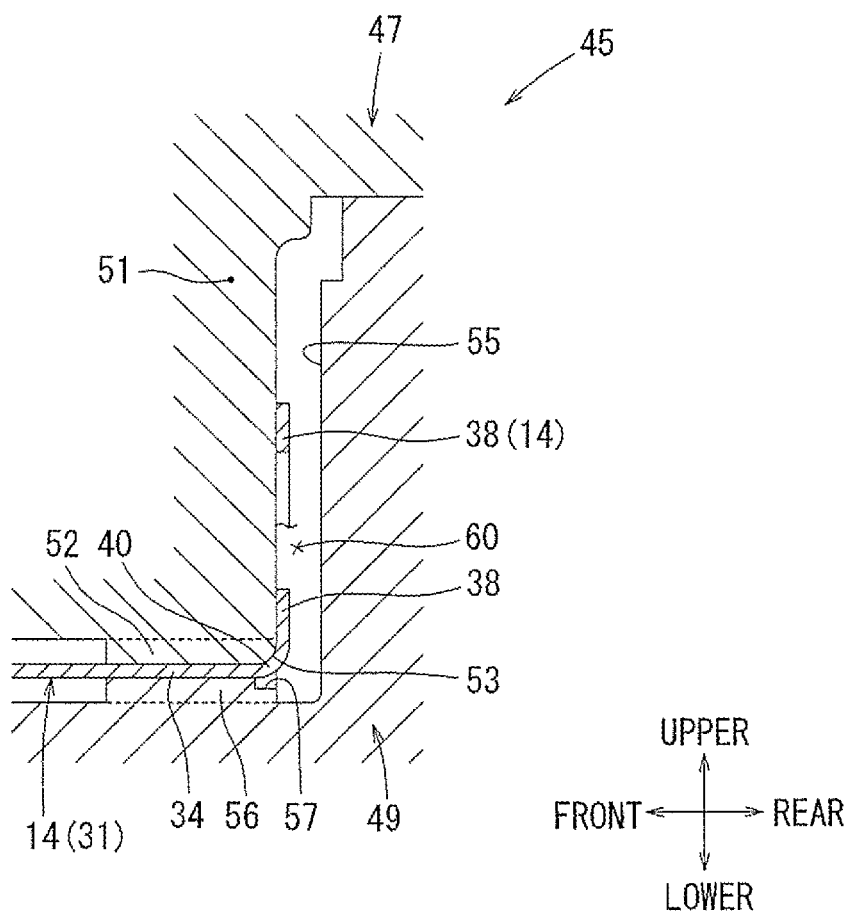
FIG. 12 is a cross-sectional view of a part of a mold.

Next, a mold 45 used for the insert molding of the housing 10 will be described. FIG. 12 is a cross-sectional view of a part of the mold 45. As shown in FIG. 12, the mold 45 includes an upper mold 47 and a lower mold 49, which are capable of being clamped and then being opened. The upper mold 47 has a convex part 51 for shaping the inner space 21 of the housing 10. In particular, the convex part 51 is formed to shape inward facing surfaces of the bottom wall 16, the front side wall 17, the rear side wall 18, the left side wall 19 and the right side wall 20 of the housing body 12. The convex part 51 has a first protrusion 52 for shaping an upper half of the first opening 26. The first protrusion 52 has rounded surfaces 53 for contacting the inward facing surfaces of the inclined portions 40 of the bus bars 14, respectively. Whereas, the lower mold 49 has a concave part 55 for shaping a lower surface and an outer circumferential surface of the housing 10. In particular, the concave part 55 is formed to shape outward facing surfaces of the bottom wall 16, the front side wall 17, the rear side wall 18, the left side wall 19 and the right side wall 20 of the housing body 12. The concave part 55 has a second protrusion 56 for shaping a lower half of the first opening 26. The second protrusion 56 has recesses 57 for each shaping the covering part 42.

A procedure of the insert molding of the housing 10 by the mold 45 will be described. In a state that the mold 45 is opened, the bus bar precursor 31 is provided in the concave part 55 of the lower mold 49. Then, the mold 45 is clamped, thereby forming a cavity 60 as viewed in FIG. 12. In this condition, the bus bar bodies 34 of the bus bars 14 are supported between the first protrusion 52 of the upper mold 47 and the second protrusion 56 of the lower mold 49. An outward facing surface of the convex part 51 closely contacts the inward facing surfaces, i.e., the front surfaces of the folded portions 38. The rounded surfaces 53 of the first protrusion 52 closely contact the inclined portions 40, respectively. Further, cavities for each forming the covering part 42 are defined by the inclined portions 40 of the bus bars 14 and the recesses 57 of the second protrusion 56 of the lower mold 49 such that the cavities are continuous to the cavity 60.

Then, by operating a screw of an injection molding machine (not shown), a resin material is injected into the cavity 60 of the mold 45 through a gate (not shown) of the injection molding machine. The resin filled in the cavity 60 forms the housing body 12 such that the bus bar precursor 31 is buried in the housing body 12. Further, the resin material flowing into the cavities, which are defined by the recesses 57 of the second protrusion 56 and the inclined portions 40 of the bus bars 14, forms the covering parts 42 at the rear side surface of the first opening 26 corresponding to the inward facing surface of the rear side wall 18 of the housing body 12 as viewed in FIG. 6. After the resin material is hardened by cooling, the mold 45 is opened for taking out a molded product, i.e., the housing 10.

According to the housing 10, in each bus bars 14 having the folded portion 38, the folded portion 38 continuously extends upward from the bus bar body 34 and is buried in the rear side wall 18 of the housing 12, so that the bus bars 14, each having the folded portion 38, can reduce molding shrinkage of the rear side wall 18 of the housing 12.

The bus bars 14 are shaped to form a desired conductive circuit including the folded portions 38. Thus, because the folded portions 38 extend upward, an area of the conductive circuit extending horizontally can be decreased, thereby downsizing the housing body 12 and the housing 10. Here, the folded portions 38 may not be included in the conductive circuit.

The inward facing surfaces, i.e., the front surfaces of the folded portions 38 of the bus bars 14 are exposed at the inward facing surface, i.e., the front surface of the rear side wall 18 of the housing body 12. Thus, during the insert molding, the convex part 51 of the upper mold 47 can be contacted with the inward facing surfaces of the folded portions 38 of the bus bars 14, thereby easily positioning the bus bars 14.

The bottom wall 16 of the housing body 12 has the first opening 26 exposing the inward facing surfaces of the inclined portions 40, each of which is formed in a rounded shape and extends between the bus bar body 34 and the folded portion 38 or between the folded portion 38 and the end strip 39. Therefore, during the insert molding, the rounded surfaces 53 of the convex part 51 of the upper mold 47 can be contacted with the inward facing surfaces of the inclined portions 40 of the bus bars 14, thereby easily positioning the bus bars 14.

The first opening 26 of the housing body 12 exposes inward facing surfaces and outward facing surfaces of both an end of the bus bar body 34 connected to the inclined portion 40 and ends of the end strips 39 each connected to the inclined portion 40. The housing body 12 has the covering parts 42 filling the recesses defined by the outward facing surfaces of the inclined portions 40 and the rear side surface of the first opening 26. Therefore, a durability of the concave part 55 of the lower mold 49 for shaping the outer circumferential surface of the housing 12 can be improved, and formation of burrs can be prevented or decreased. For example, even if the concave part 55 of the lower mold 49 has wedge-like parts fitting with the recesses defined by the outward facing surfaces of the inclined portions 40 and the rear side surface of the first opening 26, tips of the wedge-like parts would tend to become high temperature during the insert molding, thereby decreasing the durability of the mold, and formation of burrs would frequently occur. By contrast, when the housing body 12 has the covering parts 42 filling the recesses defined by the outward facing surfaces of the inclined portions 40 and the rear side surface of the first opening 26, it is not necessary to form the wedge-like parts at the concave part 55 of the lower mold 49. Thus, the durability of the lower mold 49 can be improved, and the formation of burrs can be prevented. In addition, prevention of the formation of burrs results in reduction of deburring steps and decrease in both adhesion of burrs to the housing 10 and contamination of burrs into the housing body 12.

The first opening 26 of the housing body 12 exposes the inward facing surfaces and the outward facing surfaces of both the end of the bus bar body 34 connected to the inclined portion 40 and the ends of the end strips 39 each connected to the inclined portion 40. Thus, terminals of the electronic components can be connected to the bus bar bodies 34 in the first opening 26 of the housing body 12 such that the electronic components are disposed close to the front side wall 17, thereby downsizing the housing body 12 and the housing 10.

This disclosure is not limited to the above-described example and can be modified without departing from the scope of the invention. For example, the housing 10 can be used for various electronic circuit units instead of the fuel pump controller. The folded portions 38 can be buried in the intermediate position of the rear side wall 18 in the front-back direction. It is sufficient that one of the folded portions 38 is buried in at least one of the rear side wall 18, the left side wall 19 and the right side wall 20. When the housing body 12 is configured to have a horizontal cross-section formed in a polygonal shape, a circular shape, an ellipsoidal shape or the like, the folded portion 38 can be buried in a first side wall part different from a second side wall part having a connector such that outer facing surfaces of the first side wall part and the second side wall part are directed to directions different from each other. The inclined portions 40 can have inclined flat surfaces instead of the rounded surfaces. The inclined portions 40 can be buried in the bottom wall 16 of the housing body 12. In this condition, the inclined portions 40 can be buried in the intermediate position of the bottom wall 16 in the vertical direction or can be buried in the bottom wall 16 such that the inward facing surfaces of the inclined portions 40 are exposed at an upper surface of the bottom wall 16. Further, the inclined portions 40 can be shortened or omitted.

The invention claimed is:

1. An electronic circuit unit, comprising:
    a housing for an electronic circuit unit, wherein the housing comprises:
        a housing body including a bottom wall part and a side wall part and defining an inner space therein, the housing body being made from a resin material; and
        a bus bar including a base portion and a folded portion, the folded portion including two ends, wherein the two ends of the folded portion are each connected to the base portion via an inclined portion between a bus bar body and the folded portion, the base portion being buried in the bottom wall part, the folded portion being buried in the side wall part.

2. The electronic circuit unit according to claim 1, wherein the folded portion of the bus bar is exposed at an inward facing surface of the side wall part of the housing body.

3. The electronic circuit unit according to claim 1, wherein the inclined portion includes an inward facing surface; and
    wherein the bottom wall part of the housing body has an opening exposing the inward facing surface of the inclined portion.

4. The electronic circuit unit according to claim 3, wherein the base portion of the bus bar includes a connection end directly connected to the inclined portion, wherein the connection end includes an inward facing surface and an outward facing surface, and
    wherein the inward facing surface and the outward facing surface of the connection end are exposed in the opening of the bottom wall part of the housing body.

5. The electronic circuit unit according to claim 3, wherein the housing body has a covering part filling an recess defined by an outward facing surface of the inclined portion and an outer periphery of the opening.

* * * * *